US006835260B2

(12) United States Patent
Fasano et al.

(10) Patent No.: US 6,835,260 B2
(45) Date of Patent: Dec. 28, 2004

(54) METHOD TO PRODUCE PEDESTAL FEATURES IN CONSTRAINED SINTERED SUBSTRATES

(75) Inventors: Benjamin V. Fasano, New Windsor, NY (US); David H. Gabriels, Cold Spring, NY (US); Richard F. Indyk, Wappingers Falls, NY (US); Glenn A. Pomerantz, Kerhonkson, NY (US); Richard A. Shelleman, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/265,516

(22) Filed: Oct. 4, 2002

(65) Prior Publication Data

US 2004/0065401 A1 Apr. 8, 2004

(51) Int. Cl.[7] .......................... B32B 31/18; B32B 31/26
(52) U.S. Cl. ................... 156/89.11; 156/89.12; 156/89.16; 156/268; 156/289
(58) Field of Search .......................... 156/89.11, 89.12, 156/268, 89.16, 281, 289

(56) References Cited

U.S. PATENT DOCUMENTS

| 5,130,067 A | * | 7/1992 | Flaitz et al. ................. 264/669 |
| 5,254,191 A | * | 10/1993 | Mikeska et al. .......... 156/89.15 |
| 5,370,759 A | * | 12/1994 | Hakotani et al. ........... 156/73.1 |
| 5,583,738 A | * | 12/1996 | Kohno et al. ................ 361/312 |
| 5,645,673 A | * | 7/1997 | Fasano et al. ............ 156/89.16 |
| 6,350,334 B1 | * | 2/2002 | Shigemi et al. ........... 156/89.12 |

FOREIGN PATENT DOCUMENTS

JP          10-200261       *  7/1998

* cited by examiner

*Primary Examiner*—Melvin C. Mayes
(74) *Attorney, Agent, or Firm*—James J. Cioffi

(57) ABSTRACT

Methods to create raised pedestal parts in ceramic substrates sintered under a load. The invention uses a patterned, buried, non-sintering layer that provides the needed transfer of load during the sintering process to the raised or pedestal portion of the substrate while maintaining dimensional control of the metallized features on the surface of the pedestal base. The methods involve cutting channels in the ceramic substrate corresponding in position to the perimeter of the opening in the patterned non-sintering contact sheet. The channels may be cut either before or after the sintering of the ceramic substrates.

17 Claims, 6 Drawing Sheets

METHOD TO PRODUCE PEDESTAL FEATURES IN CONSTRAINED SINTERED SUBSTRATES

BACKGROUND OF THE INVENTION

The present invention is directed to electronic packaging and, more particularly, is directed to a method to produce pedestal features in constrained sintered substrates. Applications for pedestal structures include providing a raised contact surface for probing wafers for burn-in and test.

Raised ceramic interconnect platforms, or pedestals, have been earlier demonstrated in free-sintered glass bonded alumina ceramic to produce pedestal substrates for electrically testing integrated devices while on a wafer. Free sintered substrates are not sintered, or fired, under a load or a constraining force. Prior methods to produce pedestal substrates use a green laminate milling process. In this method an embedded polymer sheet acts as a stop indicator and separation aid to remove surrounding unneeded ceramic features, while still in the "green" or unfired state, prior to sintering.

There are unique problems with creating pedestal features in substrates sintered under a constraining load, such as glass ceramic (GC) substrates for example. These substrates need to be sintered under a load to provide consistent control of surface (XY) features, typically because there is a mismatch in the sintering of the metal and ceramic. In these substrates there is often no flowing glass like in alumina free sintered substrates to help match densification. If the same techniques that are currently used for free sintered substrates were applied to substrates sintered under a load the pedestal portion of the substrate would collapse into the base portion. Another problem is that the features within and on the base portion would be highly distorted since there would be no constraining force on this surface. Therefore there is a need to produce a substrate which will have the desired pedestal or stepped features when processed in a constrained "Z shrinkage only" sintering environment.

There are a number of solutions proposed by others for forming elevated or stepped features in sintered substrates. Gauci et al. U.S. Pat. No. 5,478,420, the disclosure of which is incorporated by reference herein, describes a process for making cavities in ceramic substrates using a hard insert to maintain the shape of cutouts made in unfired ceramic greensheets during lamination. This disclosure describes a "free sintered" or unconstrained sintering process. Although the disclosure could be used for alternatively forming pedestals in a "reverse" cavity shape, during a constrained sintering process the cavities would tend to close up and distort under the applied sintering load which is used to prevent distortion of the ceramic surface features. This is in contrast to the present invention which applies to a constrained sintering process.

Balents et al. U.S. Pat. No. 6,033,764, the disclosure of which is incorporated by reference herein, describes a process for producing a bumped substrate assembly. The disclosure describes the build up of circuitry onto a previously sintered ceramic surface using processes such as plating, photo resist coating, surface oxidation and etching. This is in contrast to the present invention which discloses a method to sinter the entire metallization structure in one step.

Fasano et al. U.S. Pat. No. 6,139,666, the disclosure of which is incorporated by reference herein, describes the use of non-sintering contact sheets to control the exterior surface features of constrained sintered ceramic substrates. Although these methods and materials are used in the present invention to produce pedestal features, the prior reference does not disclose how to produce raised features that contain circuitry. Rather, the reference discloses the control of surface feature planar topography and the influence of the type of contact sheet used.

Fasano et al. U.S. Pat. Nos. 5,645,673 and 5,846,361, the disclosure of which is incorporated by reference herein, disclose the formation of a raised central pedestal through the use of negative pattern barrier layers. These disclosures do not address the requirement of a constraining force to control surface XY shrinkage that exist in some applications, such as glass ceramic substrates.

Shigemi et al. WO 00/26957, the disclosure of which is incorporated by reference herein, describes a process to form cavities in constrained sintered ceramic substrates by removing overlying ceramic with a laser. This method is expensive and has a potential problem in that it can lead to cracking defects along the edges that can compromise the strength of the ceramic. The present invention removes the unneeded ceramic portions using a grinding process which is more accurate and produces a smooth surface that mitigates crack sources. The present invention also discloses a process to make the pedestal using a green milling, pre-sinter, process that is not disclosed in the reference.

Notwithstanding the prior art solutions to the problem, there remains a need for a method to produce pedestal features in constrained sintered substrates.

Accordingly, it is a purpose of the present invention to have a process to produce raised ceramic interconnect platforms or pedestals in ceramic substrates that are sintered using a constraining force to improve dimensional control.

These and other purposes of the present invention will become more apparent after referring to the following description considered in conjunction with the accompanying drawings.

BRIEF SUMMARY OF THE INVENTION

The purposes and advantages of the present invention have been achieved by providing, according to a first aspect of the invention, a method to produce a raised pedestal on a ceramic substrate fired under a constraining force comprising the steps of:

forming an opening in a non-sintering contact sheet, this opening corresponding to a cross-sectional dimension or surface area of the desired pedestal and having a perimeter;

providing a first set of stacked greensheets;

placing the non-sintering contact sheet with opening on top of the first set of greensheets;

stacking a second set of greensheets on top of the non-sintering contact sheet with opening to form a completed layer stack;

placing additional non-sintering contact sheets, without openings, on the top and bottom of the completed layer stack;

firing or sintering the completed layer stack under a constraining load to form a ceramic substrate;

removing the additional non-sintering contact sheets;

cutting channels in the ceramic substrate corresponding in position to the perimeter of the opening in the non-sintering contact sheet, the depth of the channels being sufficient to contact the patterned non-sintering contact sheet and selectively removing the ceramic material above the non-sintering contact sheet to form a raised pedestal in the ceramic substrate.

According to a second aspect of the invention, there is provided another method to produce a raised pedestal on a ceramic substrate fired under a constraining force comprising the steps of:

forming an opening in a non-sintering contact sheet, the opening corresponding to a cross-sectional dimension or surface area of the desired pedestal and having a perimeter;

stacking a first set of greensheets;

placing the non-sintering contact sheet with opening on top of the first set of greensheets;

stacking a second set of greensheets on top of the non-sintering contact sheet with opening to form a completed layer stack;

placing additional non-sintering contact sheets, without openings, on the top and bottom of the completed layer stack;

cutting channels in the completed layer stack corresponding in position to the perimeter of the opening in the non-sintering contact sheet, the depth of the channels being sufficient to contact the patterned non-sintering contact sheet;

firing or sintering the completed layer stack under a constraining load to form a ceramic substrate;

removing the additional non-sintering contact sheets and selectively removing the ceramic material above the non-sintering contact sheet to form a raised pedestal on the ceramic substrate.

According to a third aspect of the invention, there is provided another method to produce a raised pedestal on a ceramic substrate fired under a constraining force comprising the steps of:

forming an opening in a non-sintering contact sheet, the opening corresponding to a cross-sectional dimension of the desired pedestal and having a perimeter;

stacking a first set of greensheets;

placing the non-sintering contact sheet with opening on top of the first set of greensheets;

stacking a second set of greensheets on top of the non-sintering contact sheet with opening to form a completed layer stack;

placing additional non-sintering contact sheets, without openings, on the top and bottom of the completed layer stack;

cutting channels in the completed layer stack corresponding in position to the perimeter of the opening in the non-sintering contact sheet, the depth of the channels being sufficient to contact the patterned non-sintering contact sheet;

filling the channel with a non-sintering material;

firing or sintering the completed layer stack under a constraining load to form a ceramic substrate;

removing the additional non-sintering contact sheets and selectively removing the ceramic material above the non-sintering contact sheet to form a raised pedestal on the ceramic substrate.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The purposes of the present invention have been achieved by providing two different methods to create raised pedestal parts in ceramic substrates sintered under a load. The invention includes the use of a patterned, buried, non-sintering layer that provides the needed transfer of load during the sintering process to the raised (pedestal) portion of the substrate while also maintaining excellent dimensional control of the metallized features on the surface of the base.

Two different methods disclosed are a post sinter cutting method and a green milling method. Both methods produce a pedestal part using a constrained sintering process with high dimensional control of the raised pedestal feature. In either method the buried non-sintering layer may be scaled in anticipation of expansion or shrinkage to produce the pedestal XY size. Preferably, the buried non-sintering layer should be thin to prevent localized distortion. Ideally, the buried non-sintering layer is in the range of 2 to 8 mils thick (0.002 inches to 0.008 inches), and preferable 2 to 6 mils thick (0.002 inches to 0.006 inches).

An important feature of constrained sintering of glass ceramic with surface metal features is the use of essentially non-sintering contact sheets. Contact sheets are typically made from aluminum oxide powders and are used to control surface dimensions during sintering. These contact sheets are placed on the top and bottom surface of the pre-fired substrate and provide frictional control over movement of top surface metallurgy (TSM) and bottom surface metallurgy (BSM) features. For example, in the glass ceramic/copper paste system they control surface feature (XY) shrinkage to within +/−0.1%.

Another important feature of constrained sintering is to transmit the constraining load from the sinter hardware to the laminate, or unfired or pre-sintered substrate, to provide essentially only vertical or Z shrinkage. The essentially non-sintering contact sheets placed on the surface also prevent indentations from being transmitted from this hardware to the surface of the substrate.

Figure 1:
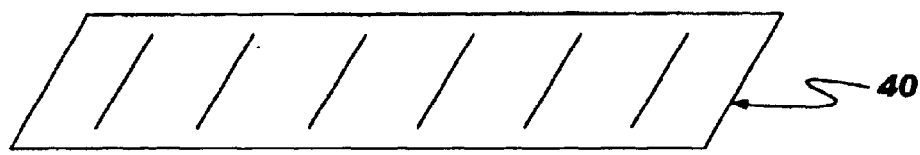
FIG. 1 is a schematic illustration of the layer stack of the present invention.
Figure 1:
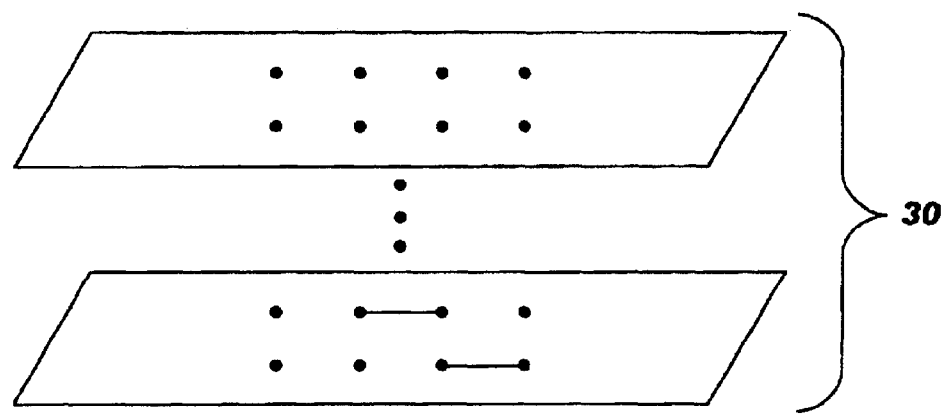
Figure 1:
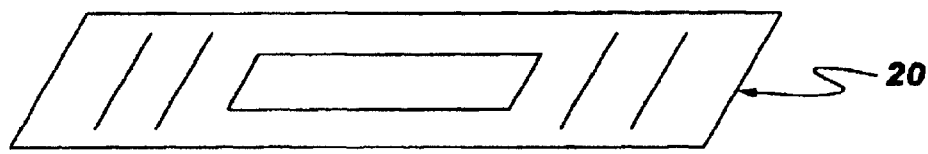
Figure 1:
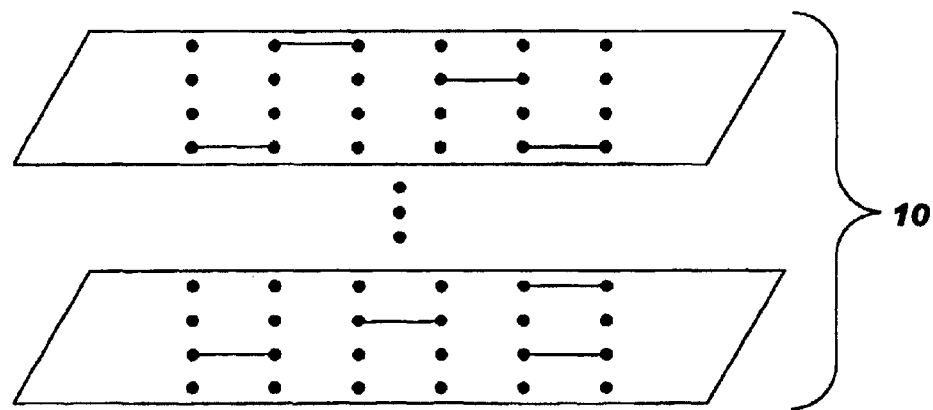
Figure 1:
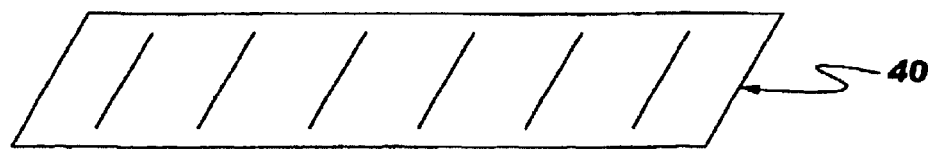

Referring now to FIG. 1 a first method of forming a pedestal substrate is shown. A non-sintering contact sheet has an opening cut out approximating the dimensions of the raised pedestal surface (XY) perimeter. The tailored or patterned contact sheet 20 is placed between bottom layers 10 and top layers 30 of the unfired substrate or laminate at the pedestal-base interface. The top layers 30, which will form the pedestal, are then stacked on top of the tailored or patterned contact sheet. The bottom layers will typically be metallized, i.e., contain conductive vias and lines. The portion of the top layers corresponding to the pedestal region may also contain conductive vias and lines.

Regular, or non-tailored non-sintering contact sheets 40 are then placed on the top and bottom surfaces of the laminate. The laminate is then sintered under a constraining load. After sintering the surface contact sheets are removed. The next step is mechanically machining the overlaying ceramic layers to form the pedestal side walls and expose the base surface metal.

Figure 2:
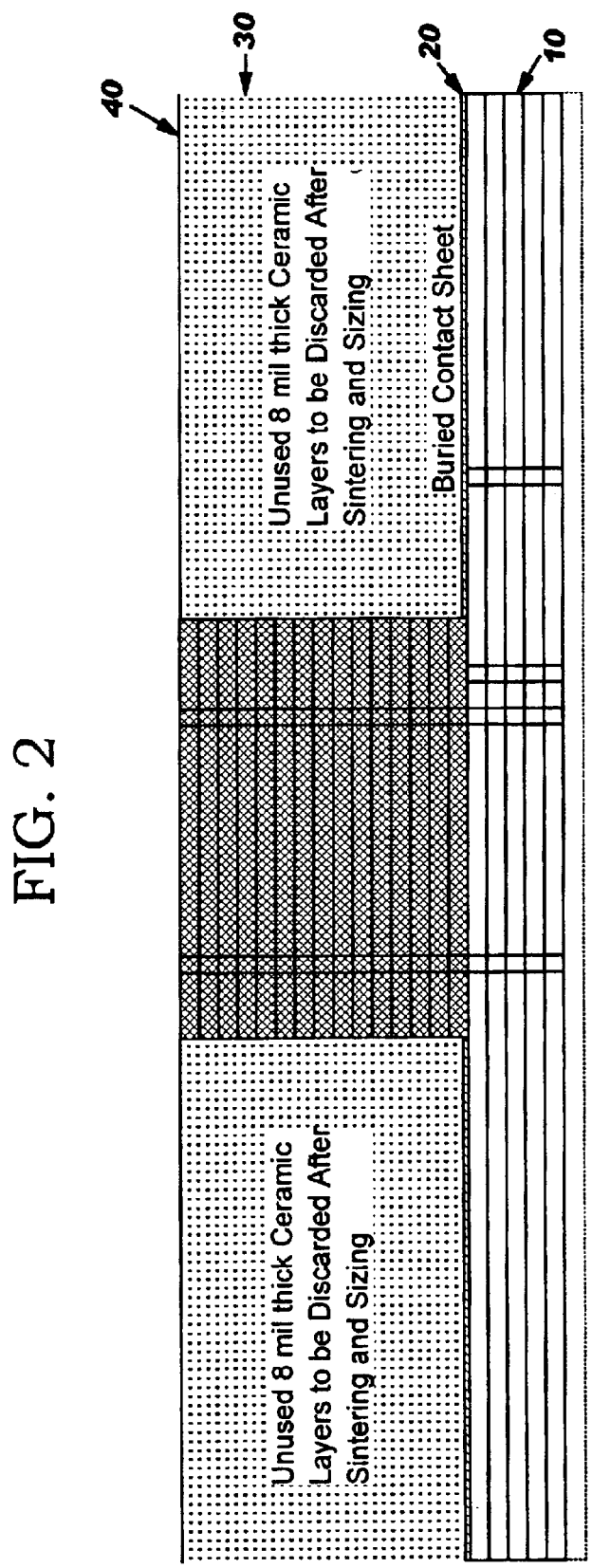
FIG. 2 is a schematic illustration of the wet milling post sinter method.

Referring to FIG. 2, this wet milling post sinter method of constructing a pedestal substrate using a constrained sintering load is described in more detail. It consists of punching greensheets 10 and applying metallizing paste onto and into layers as normally used for multilayer substrates. To form the pedestal a hole is cut into a non-sintering contact sheet 20. This hole is in the shape or desired cross-sectional dimension of the desired pedestal outline and forms an opening with a perimeter corresponding roughly to the dimensions of the finished pedestal XY size. This is preferably cut with a laser or mechanical punch so that an opening corresponding roughly to the dimensions of the finished pedestal perimeter (XY) size is produced in the desired position in the contact sheet. In the case of a multi-up laminate, for providing multi-up pedestal substrates, many cutouts are placed in the contact sheet layer.

Subsequently, additional metallized layers 30 are aligned and stacked as typically practiced prior to lamination with the exception that the contact sheet with the cutout, or multiple cutouts in the case of a multi up application, is placed into the stack where the pedestal is to be formed. The contact sheet with the cutout is placed into the stack above where the pedestal is to be formed on the base. The rest of the metallized layers are then aligned and stacked above this as typically practiced prior to lamination to form the completed layer stack. Standard non-sintering contact sheets 40 are placed on the top and bottom of the completed layer stack. Sizing fiducials or alignment marks can be present on the contact sheets. The completed layer stack is then laminated, i.e., heated and pressed to form a laminate.

After lamination the laminate is fired or sintered under load in a constrained environment and the ceramic and overlying contact sheets 40 are then removed by ultrasonic cleaning or abrasive or mechanical separation, perhaps assisted by ultrasonic agitation in a liquid such as water. Then the parts can be cut into individual substrates if a multi up laminate has been processed. In the case of a multi-up substrate a wet size using a diamond saw is used to form individual "ups" or substrates is performed, preferably with the aid of sizing fiducials in or on the underlying ceramic surface.

Figure 3:
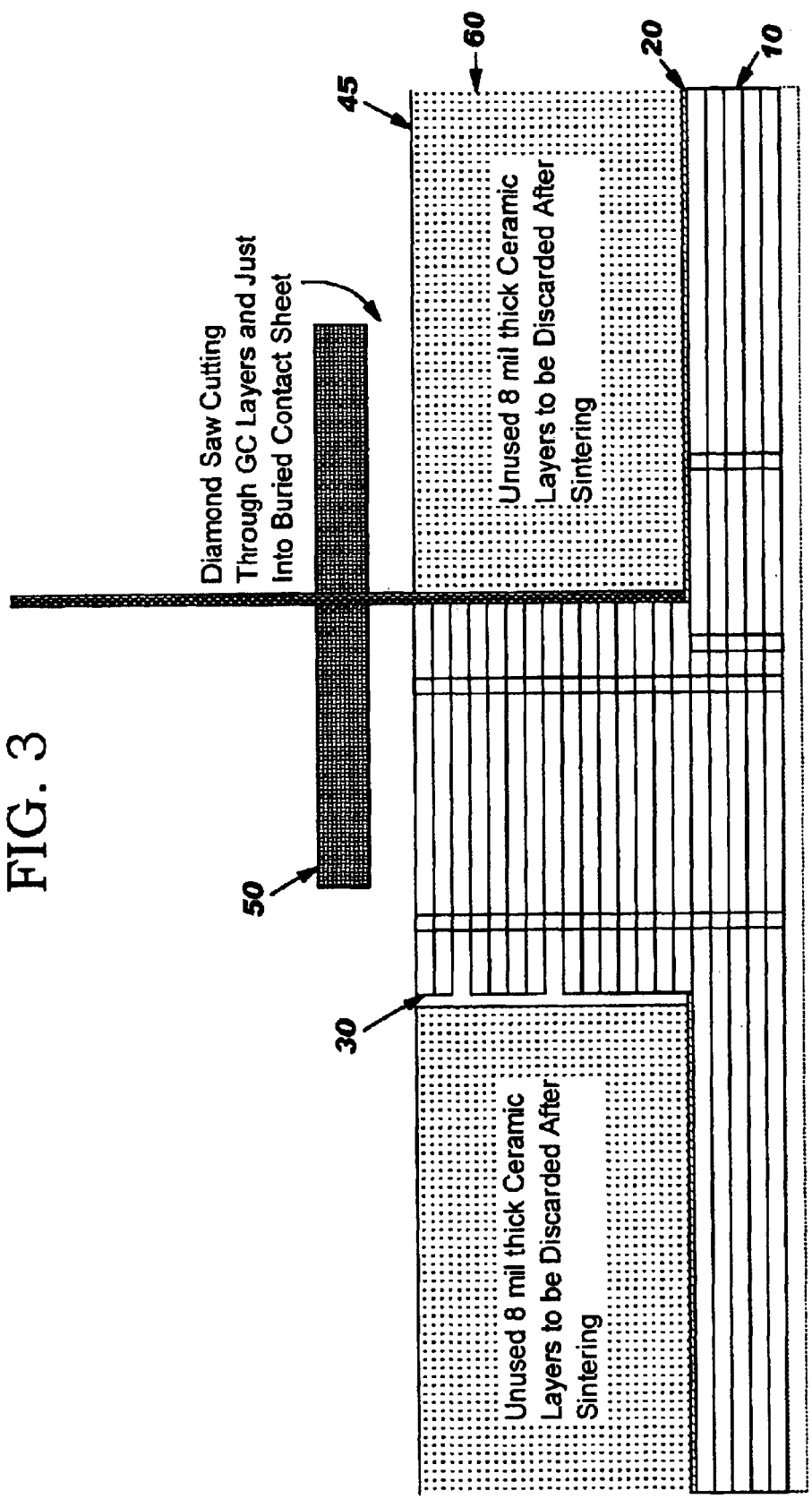
FIG. 3 is a schematic illustration of the wet milling post sinter sizing.

Referring now to FIG. 3, a post sinter wet slotting is then performed to define the pedestal perimeter or XY size. Channels or slots are cut in the fired ceramic to a depth so as to just contact the buried non-sintering contact sheet 20. Preferably this wet sizing of the pedestal feature XY size, by cutting through the overlying ceramic layers 30 above the buried contact sheet 20 and just into the buried contact sheet 20, is done with a diamond wheel or saw 50. This is preferably done referencing surface fiducials located on the top ceramic surface 45.

The wet sizing is typically done in 4 cuts to form a square or rectangular pedestal shape. Each cut is made close enough to the pedestal edge so as to remove the notch caused by the flow of overlying and underlying ceramic layers surrounding the buried contact sheet. This requires depth control to stay within the buried contact sheet width. It is preferred to use a thin contact sheet to minimize pedestal/base/surface wiring distortion.

The next step is the removal of the remaining portions of unused ceramic layers surrounding the pedestal 60 to expose the base surface and form the pedestal. They are preferably removed by mechanical separation or ultrasonic agitation. Often the remaining portions of unused ceramic are separated easily by hand. In some cases a slight prying action is needed with a thin blade to assist in separating the remaining portions of unused ceramic.

The thickness of the buried contact sheet is critical to reducing the wiring distortion at the transition from pedestal to base. Ideally a very thin contact sheet is used, but not so thin that the depth of cut required while cutting the pedestal and stopping just in or at the buried contact sheet cannot be accurately determined. A thickness range of 2 to 8 mils (0.002 inches to 0.008 inches) is recommended, preferably 2 to 6 mils (0.002 inches to 0.006 inches).

Figure 4:
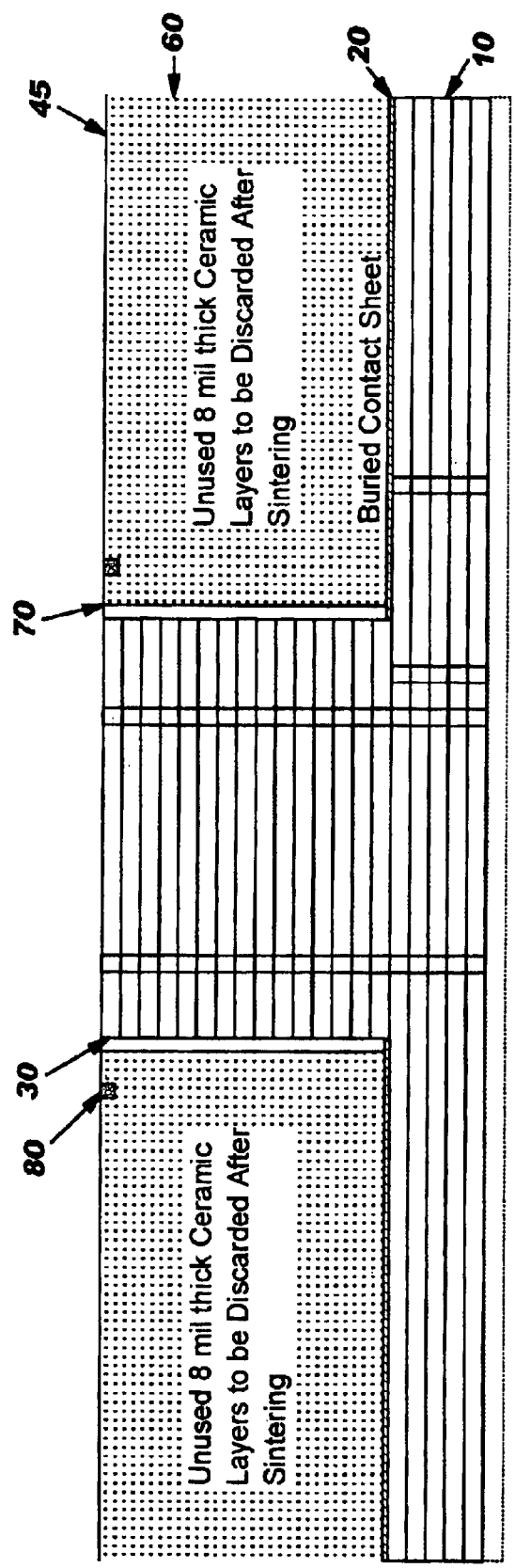
FIG. 4 is a schematic illustration of the green milling pre sinter method.

Referring now to FIG. 4, a second method is shown which involves machining the unfired laminate to form a channel or "moat" around the pedestal in the green or unfired state. The channel is then used to define the finished pedestal perimeter or XY dimensions while the buried non-sintering contact sheet transfers load to the base portion to control dimensional stability during sintering.

Referring now to FIG. 4, the green milling method is described in more detail. As in the previous method standard punched greensheets 10 with metallized paste is used for the multilayer ceramic substrate. The pedestal cross-sectional dimension or outline is formed by cutting a hole in the buried non-sintering contact sheet 20, preferably with a laser. Additional metallized layers 30 are then aligned and stacked over the buried contact sheet 20 as typically practiced prior to lamination. The buried contact sheet 20 with the cutout is placed into the stack above where the pedestal is to be formed on the base. The remaining layers 30 are then stacked above the buried contact sheet 20. Typically non-sintering contact sheets 40 are placed on the top and bottom of the completed layer stack. The completed layer stack is then laminated.

A channel 70 is cut through the surface non-sintering contact sheet 40, through the underlying unfired ceramic layers 30 down to the buried contact sheet 20 to form the pedestal outline. The channel 70 is preferably formed using a milling bit (not shown). The channel 70 is sized so as to form the approximate perimeter shape or XY size of the desired pedestal. The depth of the channel 70 is such that milling stops just within the buried contact sheet 20. This is preferably determined by using a buried contact sheet which is a different color than the rest of the ceramic layers. In a preferred embodiment this is done by using a dye, preferably a UV fluorescent dye that allows immediate visual detection under a UV light. The location of the perimeter of the buried contact sheet opening is preferably determined by having surface fiducials 80 on the top ceramic surface 45 that provide reference points for milling. The top and bottom non-sintering contact sheets 40 may have clearance holes for locating fiducials 80 on a surface of the ceramic substrate.

Figure 5:
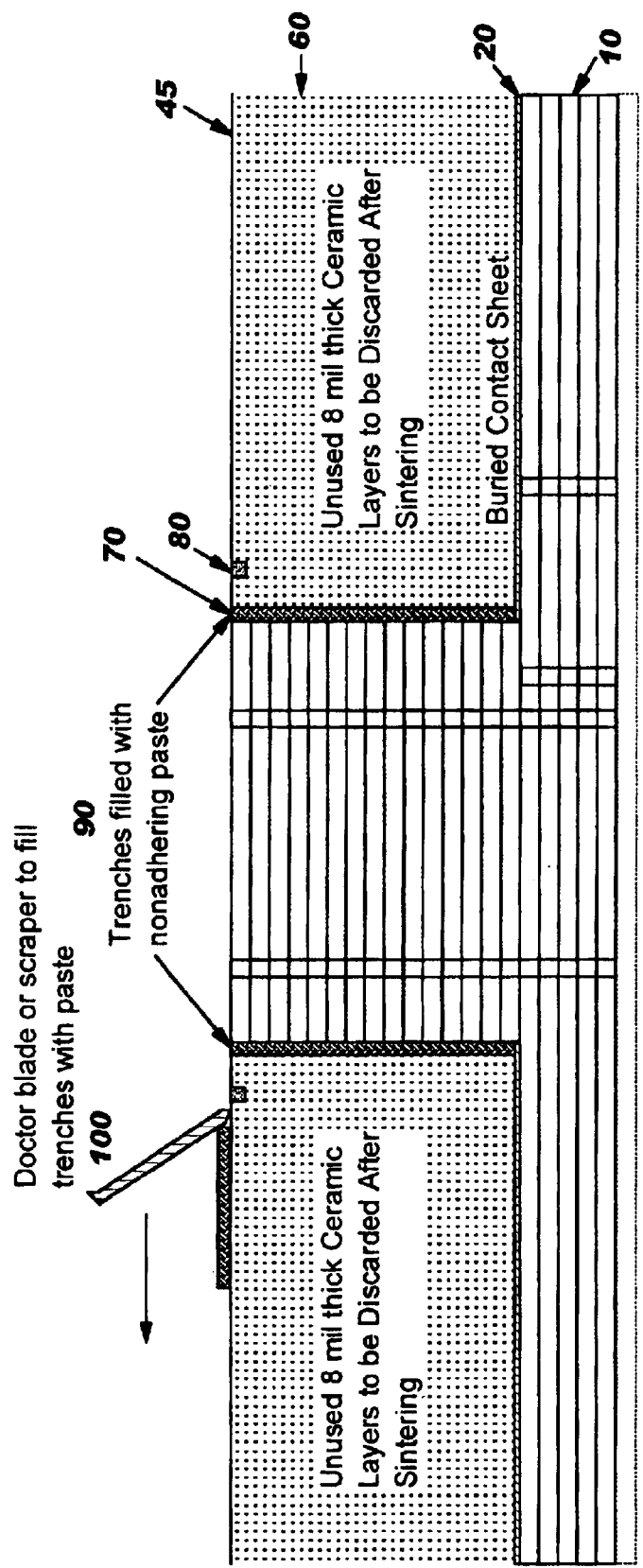
FIG. 5 is a schematic illustration of filling trenches with paste.

After the milling is complete, and depending on the sintering process and constraining pressures to be used, the substrate may be sintered as milled in the desired sintering cycle. If there is a considerable load placed onto the laminate during sintering, it is desirable to fill the milled channel in the laminate with a non-sintering material to prevent the channel side wall from collapsing during the densification process. This is illustrated in FIG. 5. In a preferred embodiment this material 90 is non-adhering paste or slurry. Examples include using a metal or ceramic paste which preferably will not stick to the side walls of the cutout channel or the buried contact sheet at the bottom of the channel. This paste can be applied using a scraper blade 100 or more neatly through a patterned screening mask (not shown) to dispense the material 90 directly into the channel 70.

Figure 6:
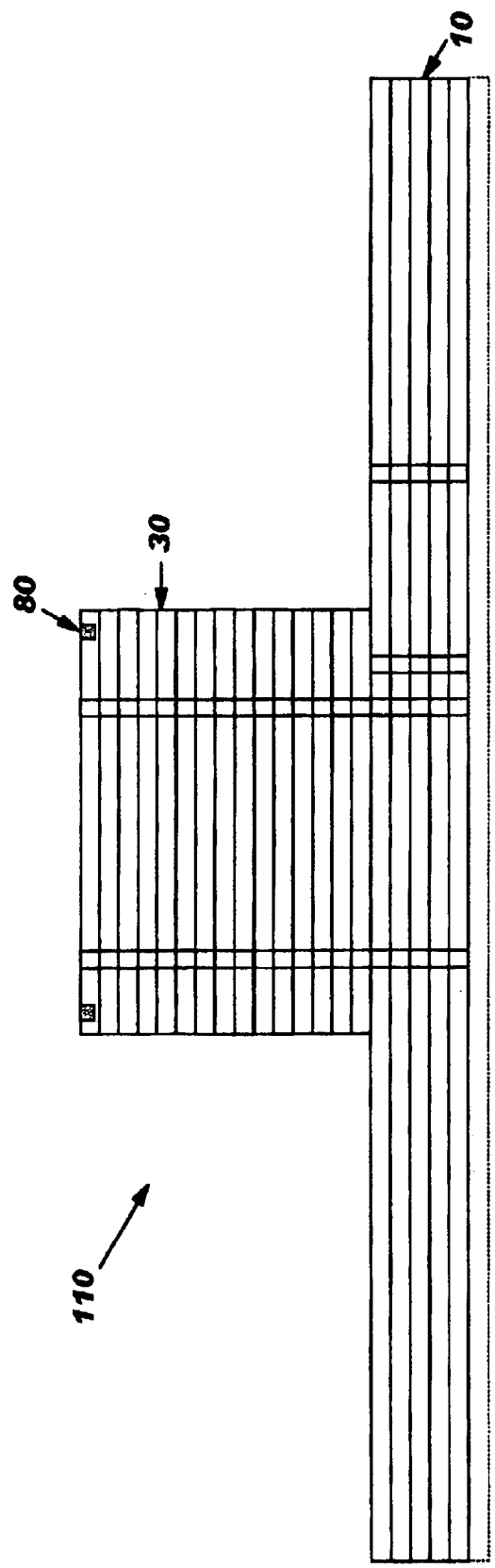
FIG. 6 is a schematic illustration of a raised pedestal ceramic substrate.

After sintering the overlying contact sheets 40 are removed by mechanical abrasion. The buried contact sheet 20 is separated by mechanical separation assisted by ultrasonic agitation in a liquid such as water. Residual contact sheet on the surface of the base or sidewalls of the pedestal is then removed by the same techniques as previously described. Both methods produce pedestal substrates 110 as illustrated in FIG. 6. The wet milling process has superior dimensional control compared to the green milling process.

It will be apparent to those skilled in the art having regard to this disclosure that other modifications of this invention beyond those embodiments specifically described here may be made without departing from the spirit of the invention. Accordingly, such modifications are considered within the scope of the invention as limited by the appended claims.

What is claimed is:

1. A method to produce a raised pedestal on a ceramic substrate fired under a constraining force comprising the steps of:
   providing a non-sintering contact sheet;
   forming an opening in said non-sintering contact sheet, said opening corresponding to a cross-section dimension of the desired pedestal and having a perimeter;
   providing a first set of greensheets;
   placing said non-sintering contact sheet with opening on top of said first set of greensheets;
   providing a second set of greensheets on top of said non-sintering contact sheet with opening to form a completed layer stack;
   providing additional non-sintering contact sheets without openings on the top and bottom of said completed layer stack, wherein said additional non-sintering contact sheets have clearance holes for locating fiducials on a surface of the ceramic substrate;
   firing said completed layer stuck under a constraining load to form a ceramic substrate;
   removing said additional non-sintering contact sheets;
   cutting channels in said ceramic substrate corresponding in position to said perimeter of said opening in said non-sintering contact sheet, the depth of said channels being sufficient to contact said patterned non-sintering contact sheet; and
   selectively removing the ceramic material above said non-sintering contact sheet to form a raised pedestal on said ceramic substrate.

2. The method of claim 1 wherein said opening is formed using a mechanical punch.

3. The method of claim 1 wherein said opening is formed using a laser.

4. The method of claim 1 wherein said first set of greensheets are metallized.

5. The method of claim 1 wherein said second set of greensheets are metallized.

6. The method of claim 1 wherein said additional non-sintering contact sheet, are removed by mechanical separation.

7. The method of claim 1 wherein said additional non-sintering sheets are removed by ultrasonic cleaning.

8. The method of claim 1 wherein said channels are cut using a diamond saw.

9. The method of claim 1 wherein multiple openings are formed in said non-sintering contact sheet, said multiple openings corresponding to said cross-sectional dimension of the desired pedestal on a multi-up ceramic substrate.

10. A method to produce a raised pedestal on a ceramic substrate fired under a constraining force comprising the steps of:
    providing a non-sintering contact sheet, wherein said non-sintering contact sheet is dyed with a UV fluorescent dye;
    forming an opening in said non-sintering contact sheet, said opening corresponding to a cross-sectional dimension of the desired pedestal and having a perimeter;
    providing a first set of greensheets;
    placing said non-sintering contact sheet with opening on top of said first set of greensheets;
    providing a second set of greensheets on top of said non-sintering contact sheet with opening to form a completed layer stack;
    providing additional non-sintering contact sheets without openings on the top and bottom of said completed layer stack;
    cutting channels in said completed layer stack corresponding in position to said perimeter of said opening in said non-sintering contact sheet, the depth of said channels being sufficient to contact said patterned non-sintering contact sheet;
    firing said completed layer stack under a constraining load to form a ceramic substrate;
    removing said additional non-sintering contact sheets; and
    selectively removing the ceramic material above said non-sintering contact sheet to form a raised pedestal on said ceramic substrate.

11. The method of claim 10 wherein said channels is formed using a milling bit.

12. A method to produce a raised pedestal on a ceramic substrate fired
    under a constraining force comprising the steps of:
    providing a non-sintering contact sheet;
    forming an opening in said non-sintering contact sheet, said opening corresponding to a cross-sectional dimension of the desired pedestal and having a perimeter;
    providing a first set of greensheets;
    placing said non-sintering contact sheet with opening on top of said first set of greensheets;
    providing a second set of greensheets on top of said non-sintering contact sheet with opening to form a completed layer stack;
    providing additional non-sintering contact sheets without openings on the top and bottom of said completed layer stack;
    cutting channels in said completed layer stack corresponding in position to said perimeter of said opening in said non-sintering contact sheet, the depth of said channels being sufficient to contact said patterned non-sintering contact sheet;
    filling said channel with a non-sintering material;
    firing said completed layer stack under a constraining load to form a ceramic substrate;

removing said additional non-sintering contact sheets; and selectively removing the ceramic material above said non-sintering contact sheet to form a raised pedestal on said ceramic substrate.

13. The method of claim 12 wherein said non-sintering material is a metal paste.

14. The method of claim 12 wherein said non-sintering material is a ceramic paste.

15. The method of claim 12 wherein said channel is filled using a scraper blade.

16. The method of claim 12 wherein said channel is filled using a patterned screening mask.

17. The method of claim 12 wherein said non-sintering contact sheet has a thickness in the range of 0.002 inches to 0.008 inches.

* * * * *